(12) United States Patent
Whelan et al.

(10) Patent No.: US 7,528,649 B2
(45) Date of Patent: May 5, 2009

(54) METHOD FOR DESIGNING INPUT CIRCUITRY FOR TRANSISTOR POWER AMPLIFIER

(75) Inventors: Colin S. Whelan, Wakefield, MA (US); Raghu Mallavarpu, Boxborough, MA (US); Matthew C. Tyhach, Medford, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 11/851,418

(22) Filed: Sep. 7, 2007

(65) Prior Publication Data
US 2009/0066411 A1 Mar. 12, 2009

(51) Int. Cl.
*G01R 19/00* (2006.01)
(52) U.S. Cl. .......................................... 330/2; 330/129
(58) Field of Classification Search ................ 330/2, 330/129, 136
See application file for complete search history.

(56) References Cited

U.S. PATENT DOCUMENTS

| | | | | |
|---|---|---|---|---|
| 5,177,453 | A * | 1/1993 | Russell et al. ............... | 330/284 |
| 6,731,915 | B1 * | 5/2004 | Tran et al. ................... | 455/126 |
| 6,859,102 | B2 * | 2/2005 | Tichauer ..................... | 330/285 |
| 7,307,473 | B2 * | 12/2007 | Kusunoki et al. ........... | 330/149 |

OTHER PUBLICATIONS

Thomas A. Winslow, Power Dependant Input Impedance of Field Plate MESFETs, CSIC 2005 Digest, pp. 240-243.
Notification of Transmittal of the International Search Report dated Nov. 11, 2008, PCT/US2008/070607.
The International Search Report dated Nov. 11, 2008 PCT/US2008/070607.
Written Opinion of the International Searching Authority dated Nov. 11, 2008 PCT/US2008/070607.
Kazuki Tateoka, Akihisa Sugimura, Hidetoshi Furukawa, Noriyuka Yoshikawa, and Kunihiko Kanazawa, A GaAs MCM Power Amplifier of 3.6 V Operation with High Efficiency of 49% for 0.9 GHz Digital Cellular Phone Systems, Aug. 1, 1995, pp. 2539-2542.
Haitao Zhang, Huai Gao, Guann-Pyng Li, A Novel Tunable Broadband Power Amplifier Module Operating From 0.8 GHZ to 2.0 GHz, 2005, pp. 661-664.
David Schmelzer, Stephen I. Long, A GaN HEMT Class F Amplifier at 2 GHz with > 80% PAE, 2006, pp. 96-99.
James C.M. Hwang, Wide-bandgap-semiconductor Wide-bandwidth Wide-temperature-range Power Amplifiers, 1999, pp. 51-54.

* cited by examiner

*Primary Examiner*—Henry K Choe
(74) *Attorney, Agent, or Firm*—Daly, Crowley, Mofford & Durkee, LLP

(57) ABSTRACT

A circuit having: an input matching network; a transistor coupled to an output of the input matching network; and wherein the input matching network has a first input impedance when such input matching network is fed with an input signal having a relatively low power level and wherein the input matching network has an input impedance different from the first input impedance when such input matching network is fed with an input signal having a relatively high power level.

2 Claims, 10 Drawing Sheets

METHOD FOR DESIGNING INPUT CIRCUITRY FOR TRANSISTOR POWER AMPLIFIER

TECHNICAL FIELD

This invention relates generally to transistor power amplifiers and more particularly to input circuitry for such transistor power amplifiers.

BACKGROUND AND SUMMARY

As is known in the art, it is frequently desirable to operate the amplifier linearly and with high efficiency over a wide range of input power levels. In order to design such a power amplifier, a fixed input impedance network is designed which compromises between performance at high input power levels and low input power levels.

As is also known in the art, Gallium Nitride (GaN) transistors are high band gap semiconductor devices that operate at high voltages (typically, 20 to 50V) and high current densities (up to 1.5 A/mm). The devices have been demonstrated to produce 6 W/mm for large periphery devices (over 2 mm) over the frequency range from 2 to 20 GHz. At still higher frequencies up to 40 GHz the transistors have been shown to produce up to 4 W/mm of output power.

One type of GaN includes a Gamma gate, (i.e., a gate with an overhang extending into the gate drain region sometimes also referred to as a field plate), as shown in FIG. 4. The purpose of the overhang is to reduce the fields in that region so that the transistor can be operated at high voltages to utilize the wide band gap properties of GaN. This is the type of transistor that is generally used in all our MMIC design applications at S-, C-, X- and Ku-bands. Transistors such as GaN are used to design high power amplifiers for use in military radars, communication and commercial base station applications. A power amplifier is usually designed to operate over a specified band of frequencies at a specified power level. At a given frequency within the band, the amplifier response is gauged by its transfer characteristics, i.e., output power versus the input power (drive). As the input drive is increased the output power is a linear function of the input power initially, but eventually reaches saturation or compression.

As is known, small signal means linear operation of a transistor (FET) and large signal means non-linear operation of the transistor. Linear operation, by definition, means minimal perturbation of a system or an amplifier. For an amplifier, with less than 20 dB of gain that produces 1 W of saturated output power, the application of an input drive power of a few milliwatts would be considered as linear operation. The response of the amplifier is given by a linear equation: Pout=(SS Gain)×Pin, where SS Gain is the small signal gain of the amplifier and is a constant in the equation. As Pin is increased this relationship holds up to an input drive level beyond which SS Gain is replaced by LS Gain (large signal gain) which is no longer a constant. At a certain drive level LS Gain is lower than SS Gain by 1 dB and is the region in the Pout vs Pin transfer curve that is called 1 dB compression point. Beyond the 1 dB compression point a normal amplifier will follow the gain response of 1 dB drop in gain for 1 dB increase in Pin (1 dB/1 dB) as shown in FIG. 5. An amplifier that deviates from this gain response in the large signal region by displaying a slope of 1 dB/2 dB or 1 dB/3 dB and so on can be described as having soft compression.

At microwave frequencies where there is spatial and time dependence of voltage and current it is customary to use power instead of voltage. The voltage is proportional to square root of the power. Each power level of an amplifier corresponds to a voltage and current. In the small signal regime the voltage and current are sinusoidal. In the large signal regime sinusoidal inputs can lead to an output with distorted voltage and current shapes. So it becomes easier to talk in terms of power. In the small signal region the power can be obtained by simple multiplication of Voltage and Current. In the large signal region Power is integration of a complex voltage and current over a cycle.

Typical transfer characteristics of a transistor or a power amplifier are shown in FIG. 5, illustrating a linear region at the lower input power levels and a hard saturation region at the higher input power levels. Also plotted on the same FIG. 5 are solid lines illustrating transfer characteristics of an ideal transistor. Both curves have a common X-axis labeled Pin(dBm) (input drive level). The top curve is Pout or power out versus Pin. The bottom curve is Gain in dB vs Pin.

GaN based transistors with field plates and power amplifiers operating at high voltages have been observed to exhibit "soft compression" characteristics depicted by the dotted curve in the same FIG. 5. The 1 dB compression of the transistor occurs at Pin=9 dBm, while the "ideal" transistor saturates for Pin=13 dBm or greater. Because of soft compression the non-ideal FET will require a higher input drive level to obtain power saturation of the device and the amplifier designed with such FETs will also require a higher drive than normal. Furthermore, a 2-stage GaN amplifier will require a conservative choice of the FET ratio between stages, thereby contributing to reduced efficiency.

The method used to design an input impedance for the transistor has typically been as follows: First, the output tuner load is matched to 50 Ohms. Next, a small signal source pull is used to determine best source match for the best output power. (A source or load pull refers to the technique of varying either the input or output match of the transistors around the Smith chart until the optimum performance is achieved.) Alternatively, the source match location on the Smith chart can also be obtained from S-parameters of the device at a predetermined frequency within the normal operating range of the device, here for example a frequency of 3 GHz. This source match is also called a small signal conjugate match to the input of the device. Next, with this fixed source match, a load pull is performed on the device from low to high drive levels. The drive level should be high enough to drive the output at least 3 dB into compression. Next, power and efficiency contours are generated from low to high drive levels and the location of the power and efficiency load targets are noted. Next, Pout versus Pin transfer curves are obtained at the power and efficiency load targets. The system also records Gt and Gp (transducer gain and power gain), reflected power from the device input (S11) or return loss among several other measurement related parameters. The transfer curves Pout vs Pin clearly exhibit soft compression characteristics, as shown in FIG. 5. Note the input drive level required to saturate the device.

Thus, when the input of the GaN devices is matched using the conventional small signal conjugate match or matched at low drive, the devices exhibit "soft" compression characteristics, rather than the 1 dB/1 dB hard compression knee that is desired, as displayed by the transfer characteristics of Pout vs Pin.

Applicants have discovered that there is significant degradation to amplifier efficiency at high input power levels using a fixed input impedance network, (i.e., an input impedance having components which are the same at both low input power levels and high input power levels). This significant degradation has been determined by the applicants when such input impedance networks are coupled to the gate electrode of transistors having field plates and with GaN transistor power amplifiers. More particularly, with regard to GaN transistors, such transistors have been found to exhibit soft compression (i.e., a gradual transition between a linear amplification region of the transistor and a non-linear amplification region of the transistor).

Still more particularly, applicants have discovered that soft compression in GaN devices can be significantly reduced or eliminated using a matching procedure at the input of the device with relatively large input signal drive levels rather than with relatively low signal input drive levels. More particularly, upon re-matching the device under large signal conditions or high drive and then sweeping the transfer curves at a power or efficiency power load, the soft compression features in the transfer characteristics are significantly removed or eliminated.

In accordance with the present invention, a circuit is provided having: an input matching network; a transistor coupled to an output of the impedance network; and wherein the input matching network has a first input impedance when such input matching network is fed with an input signal having a relatively low power level and wherein the input matching network has an input impedance different from the first input impedance when such input matching network is fed with an input signal having a relatively high power level.

In one embodiment, the transistor has a field plate.

In one embodiment, the transistor is a gallium nitride transistor.

In accordance with another feature of the invention, a circuit is provided having: a transistor having an input electrode; an input matching network having an input fed by an input signal and having an output connected to the input electrode of the transistors; a power level sensing circuit fed by the input signal; and wherein the input matching network is responsive to the power level sensing circuit to: configure the input matching network with a first input impedance when such power level sensing circuit senses the input signal has a relatively low power level; and configure the input matching network with an input impedance different from the first input impedance when such power level sensing circuit senses the input signal has a relatively high power level.

In one embodiment, the input matching network has a first inductor serially coupled between the input signal and the input electrode of the transistor when such power level sensing circuit senses the input signal has the relatively high level and wherein the input matching network has a second inductor serially coupled between the input signal and the input electrode of the transistor when such power level sensing circuit senses the input signal has the relatively low power level.

In one embodiment, the input matching network comprises a pair of electrical components and at least one switch. The switch operates in response to the power level sensing circuit to electrically decouple one of the pair of electrical components from the input matching network at one of the relatively high or relatively low power levels and operates to electrically couple said one of the pair of electrical components to the input matching network at the other one of the relatively high or relatively low power levels.

The invention thus incorporates an input signal power level dependent element (i.e., a configurable input matching network). First, an optimal (i.e., impedance matched) small signal input matching network configuration is attached to the GaN transistor (i.e., the impedance of the network is the complex conjugate of the impedance of the GaN transistor). This provides good stability, return loss, and power transfer from an RF input to the amplifying transistor at low drive powers (i.e., low signal power levels), but at the expense of poor performance under high drive powers (i.e., high signal power levels). The reconfigured input matching network is then used to rotate the phase angle (i.e., match), only under high input signal power levels, to that what is optimal for realizing peak performance without soft compression. For example, at S-band for a 2.5 mm periphery transistor, this input matching network will only have to rotate the original phase angle by 10 degree clockwise on the Smith Chart. The reconfigured input matching network is disconnected from the first via switches in the RF path, activated by a power sensing diode. Under higher drive powers, the power sensing diode and associated circuit would open the RF switches (depletion-mode switch operation), connecting the second matching network to the first, causing a rotation to the optimal (i.e., impedance matched) large signal match point. The diode's size and bias would be chosen to "turn-on" at a set drive, based on amplifying stage FET periphery. With such an arrangement, the input matching network has a configuration to provide impedance matching at low input signal drive power levels and a different configuration so as to provided impedance matching at the high input signal drive power levels.

Thus, the invention incorporates a "smart", tunable or configurable input matching network with a complex, just now understand, GaN soft compression issue. The invention provides an optimal solution to low and high drive stability and performance issues.

In accordance a method is provided for designing an input network for a GaN transistor device. The method includes: driving the device through the input network with a relatively large input signal power level; varying parameters of the input network with the output of the device at a predetermined output power level; measuring transfer function performance parameters of the device as the input network parameters are varied; and selecting the input network parameters from the measured transfer function performance parameters.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
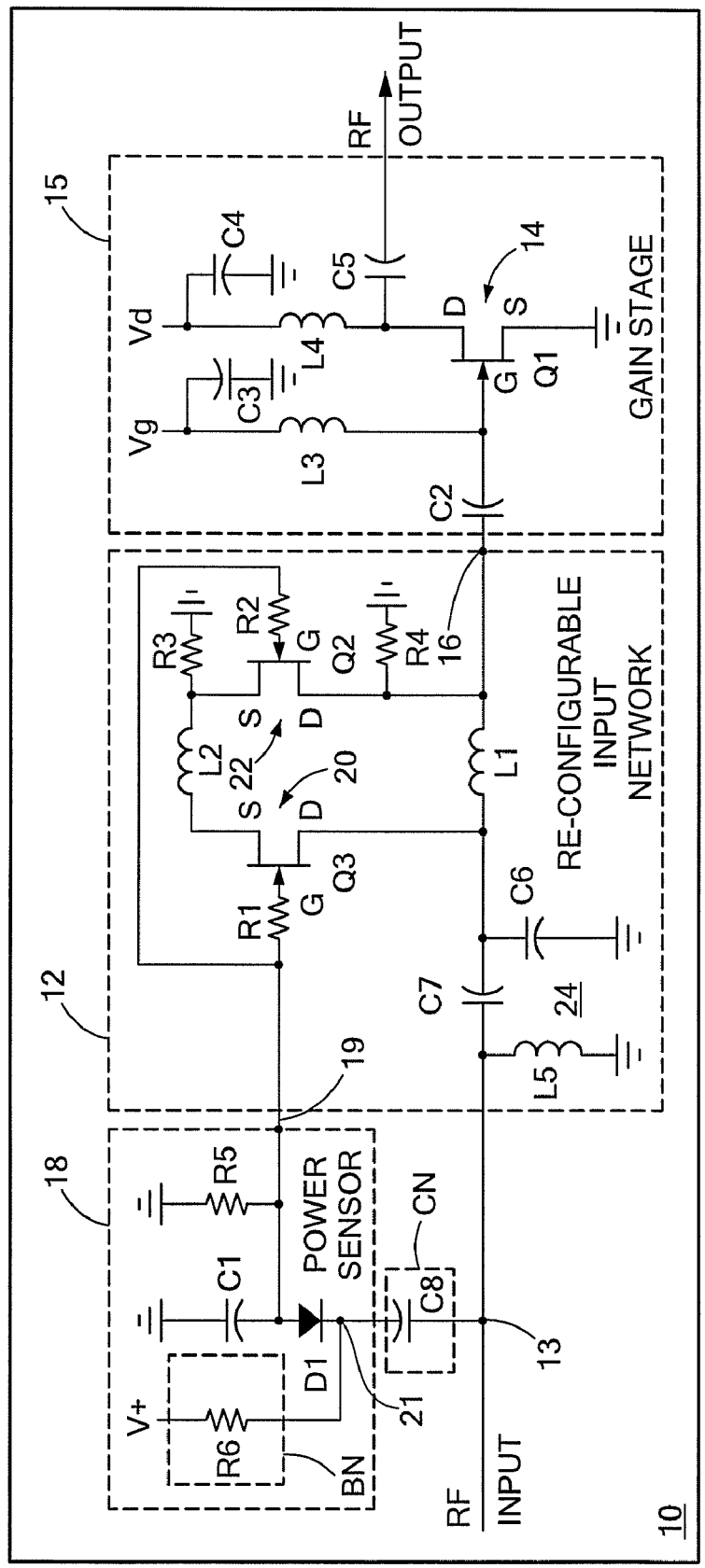
FIG. 1 is a schematic diagram of a gallium arsenide power amplifier according to the invention.

Referring now to FIG. 1, a power amplifier circuit 10 is shown to include: an input matching network 12 having an input terminal 13 for coupling to an RF input signal; an output stage 15 having a transistor 14, here a gallium arsenide (GaN) field effect transistor (FET) with a field plate, coupled to an output 16 of the input matching network 12. As will be described in more detail below, the input matching network 12 is configurable as a function of the power level, of the input signal. More particularly, the input matching network 12 is configured to have a first input impedance when such input matching network 12 is fed with the input signal having a relatively low power level and is configured to have a different input impedance from the first input impedance when such input matching network 12 is an input signal having a relatively high power level.

More particularly, the amplifier circuit 10 includes a power level sensing circuit 18 connected to input 13 and thus is fed by the input signal. As will be described in more detail below, the input matching network 12 has a first inductor L1 serially coupled between the input signal and the input electrode 16 of the transistor 14 when such power level sensing circuit 18 senses the input signal has the relatively high power level and the input matching network 12 has a second inductor L2 serially coupled between the input signal and the input electrode 16 of the transistor 14, and hence the inductors L1 and L2 are connected in parallel when such power level sensing circuit 18 senses the input signal has the relatively low power level.

Figure 2A:
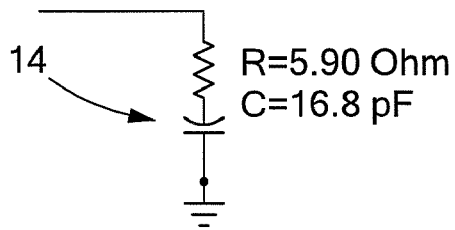
FIG. 2A is an equivalent circuit of the input impedance of a common-source configured transistor which forms the output stage of the amplifier of FIG. 1 when such amplifier is fed an input signal having a relatively low power level.
Figure 2B:
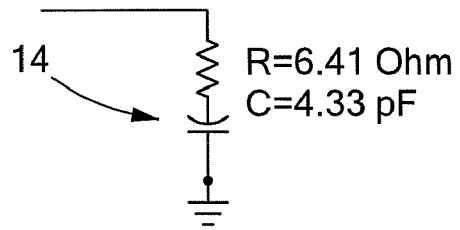
FIG. 2B is an equivalent circuit of the input impedance of a common-source configured transistor which forms the output stage of the amplifier of FIG. 1 when such amplifier is fed an input signal having a relatively high power level.

The input impedance to the transistor 14 at relatively low input signal power levels is shown in FIG. 2A and the input impedance to the transistor 14 at relatively high input signal power levels is shown in FIG. 2B. Thus, at relatively low input signal power levels, the input impedance to the transistor 14 is here in this example, a 5.90 ohm resistor in series with a 16.8 pF capacitor (here the transistor 14 having a 2.5 mm periphery and series resistor-capacitor (RC) values specified for 3 GHz), while the same transistor 14 operating at the same frequency but at a relatively high input signal power level, has an input impedance of a 6.41 ohm resistor in series with a 4.33 pF capacitor. Thus, the input impedance capacitance changes about 300 percent between the high and low power levels of the input signal. As will be described in more detail below, at relatively low input signal power levels, the input matching network 12 is configured as that shown in FIG. 3A and for relatively high input signal power levels, the input matching network is configured as that shown in FIG. 3B. It is noted that when the input matching network 12 is configured for the low input signal power level condition, a 0.422 nH inductor, provided by the parallel combination of inductor L1 and L2, is connected in series with the input impedance of the transistor, as shown in FIG. 3A and when the input matching network is configured for the high input signal power level condition, a 0.897 nH inductor, provided by inductor L1, is connected in series with the input impedance of the transistor, as shown in FIG. 3B.

Figure 3A:
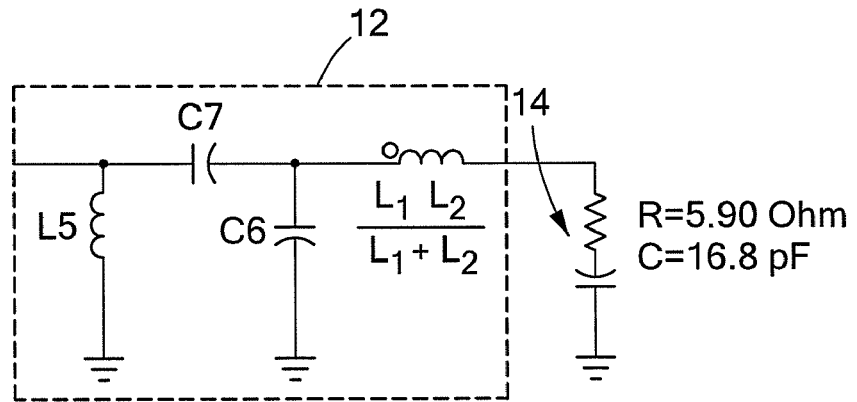
FIG. 3A is an equivalent circuit of an input matching network coupled to an input of the common-source configured transistor which forms the output stage of the amplifier of FIG. 1 when such amplifier is fed an input signal having a relatively low power level.
Figure 3B:
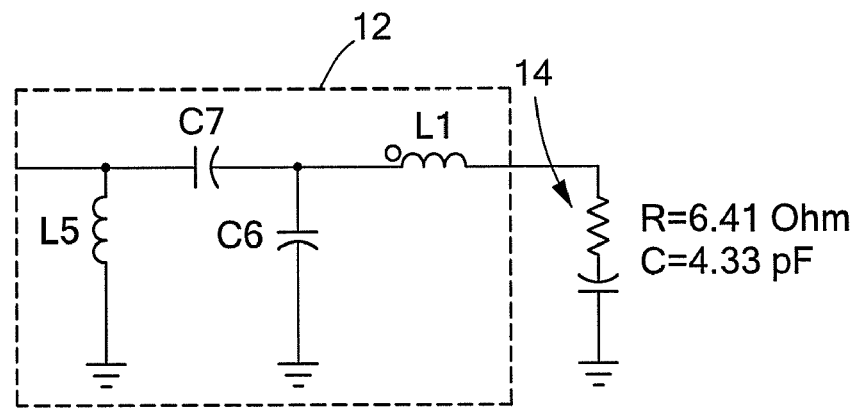
FIG. 3B is an equivalent circuit of an input matching network coupled to an input of the common-source configured transistor which forms the output stage of the amplifier of FIG. 1 when such amplifier is fed an input signal having a relatively high power level.
Figure 4:
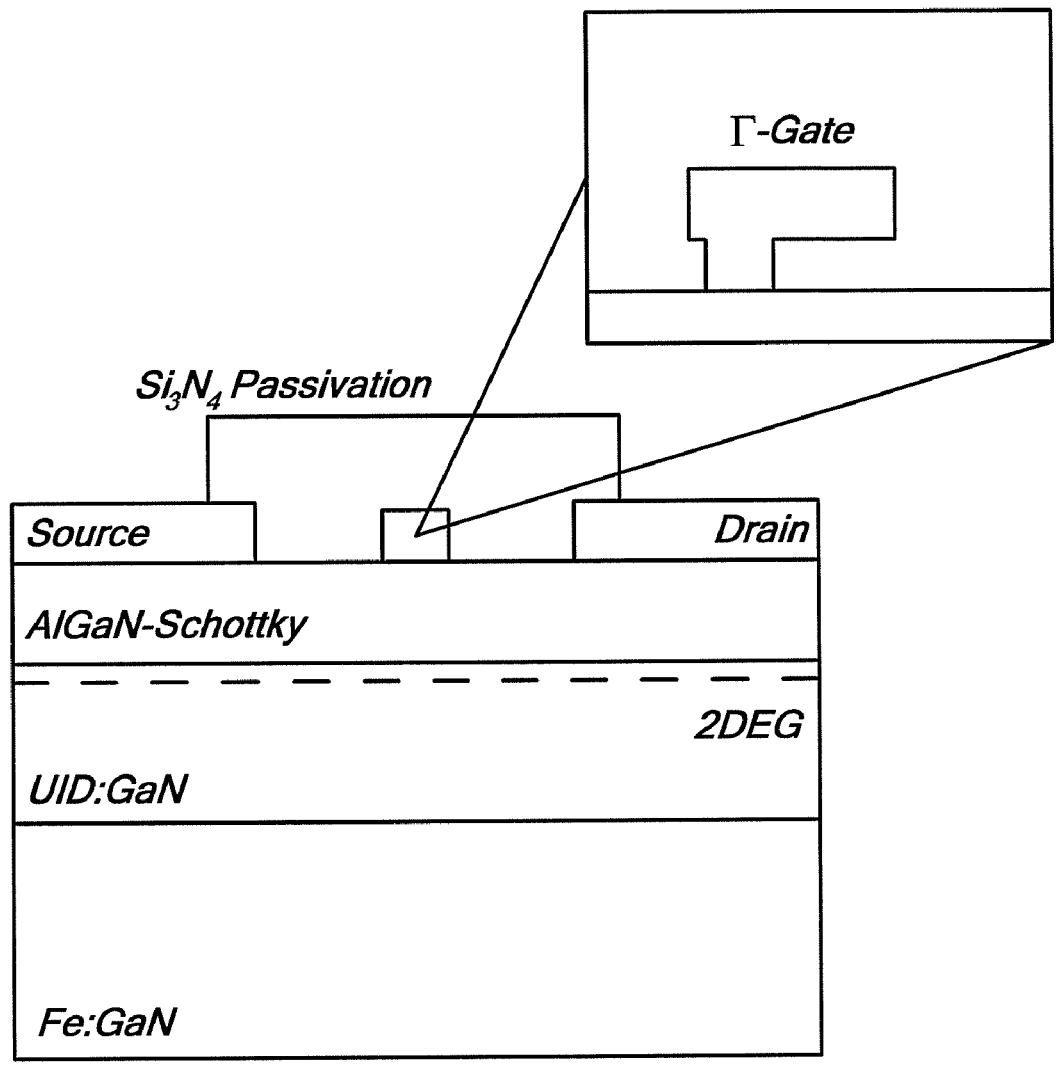
FIG. 4 is a cross-sectional sketch of a GaN transistor device with a gamma gate (field plate), such gamma gate being shown enlarged in an encircled region of the transistor.
Figure 5:
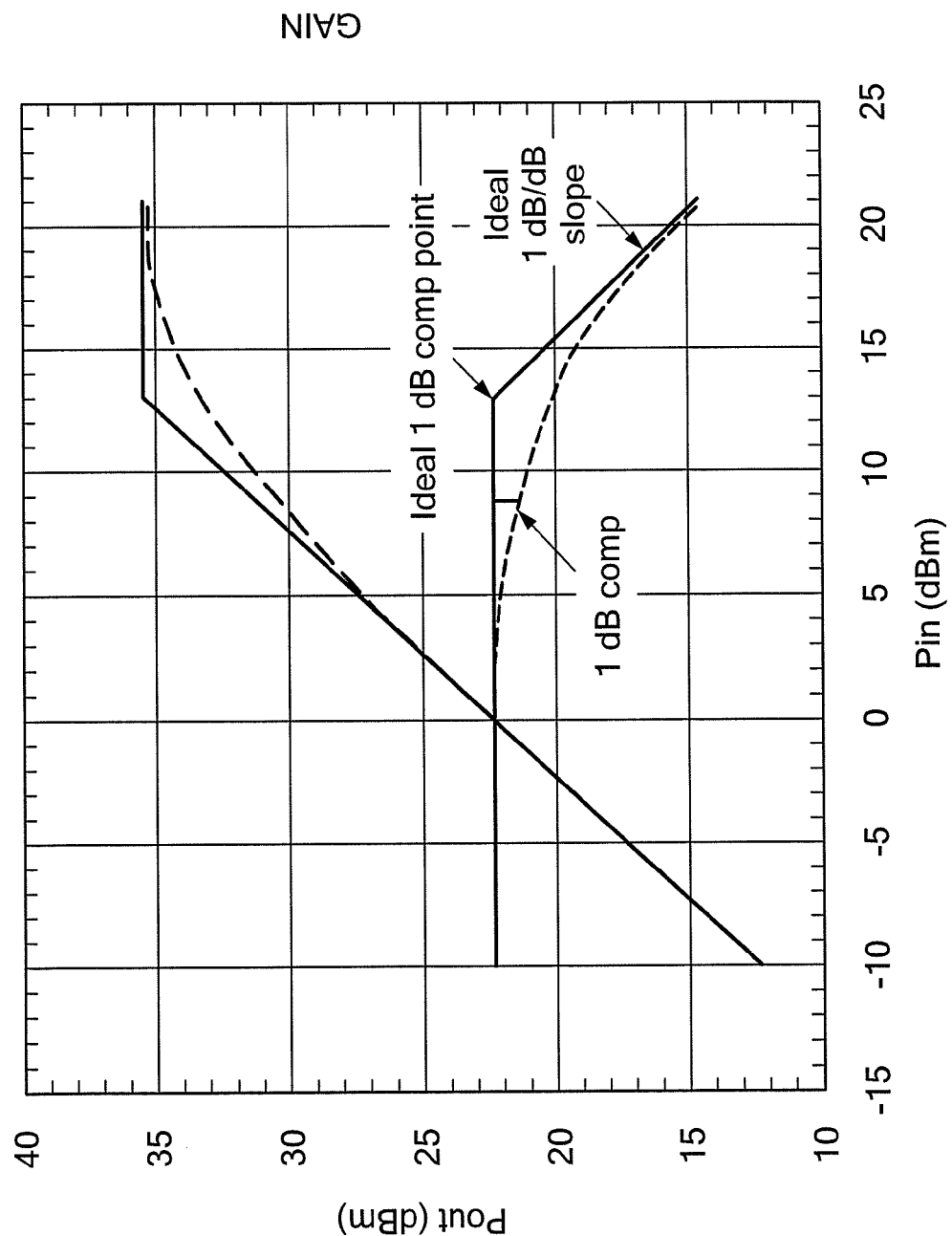
FIG. 5 are curves of output power (Pout) vs input power (Pin) Transfer characteristics of the GaN FET of FIG. 1 compared to an "ideal" transistor device.

The reconfiguration of the input matching network 12 to either that shown in FIG. 3A or that shown in FIG. 3B is through the use of the power level sensing circuit 18 which senses power of the input signal and produces a control signal on line 19 for switches 20, 22, here for example, depletion-mode FETs Q2 and Q3.

In this schematic, the GaN FET's (i.e., transistor 14) gate impedance, represented as series RC shown in FIG. 2A for low input signal power levels and shown in FIG. 2B for high input signal power levels, is transformed through the reconfigurable input matching network 12 to look similar to (i.e., impedance matched to) the characteristic system impedance; in this case 50 ohms (i.e., the input impedance of the amplifier 10).

More particularly, a coupling network, CN, here for example, shown as a capacitor C8 delivers a portion of the input signal to the power level sensing circuit 18. It should be understood that the coupling network CN might be implemented in a number of potential configurations (resistor, capacitor, coupled line . . . etc). This coupling network CN, depending on the coupling coefficient, has the ability to adjust the threshold for state change independently of a detector bias network BN, here for example as resistor R6 connected between a voltage supply (V+) and the junction 21 between the coupling network CN, here capacitor C8, and a diode D1 of the power level sensing circuit 18. The bias network BN might be implemented in a number of potential configurations (resistor, inductor, resistor divider . . . etc) also has the ability to independently adjust threshold for state change, especially through the introduction of a DC bias voltage, however, the power level sensing circuit 18 will work quite well passively (no bias). The power level sensing circuit 18 also includes a capacitor C1. The capacitor C1 charges on the negative RF half-cycle through the diode D1, and delivers a low ripple, increasingly negative voltage to a load resistor R5 with an output level related to signal level presented to D1. The voltage potential across resistor R5 is simultaneously providing a switching signal on line 19 to depletion-mode FETs (d-FETs) Q2 and Q3 gates (i.e., switches 20, 22) through isolation bias resistors R1 and R2. Bias resistors R3 and R4 may be incorporated to ensure proper Q2 and Q3 transistors switching. This results in the following behavior: (1) low RF input signal power levels produces a potential across resistor R5 that is below the absolute transistors Q2 and Q3 pinch-off voltage; d-FET drain and source are effectively shorted, and inductors L1 and L2 combine in parallel for a reduced value that optimally matches the input impedance of transistor 14 and thereby configures the input matching network to that shown in FIG. 3A; while (2) high levels of RF input signal power produces a potential across resistor R5 that is above the absolute transistors Q2 and Q3 pinch-off voltage, d-FET drain and source are effectively opened and inductor L2 is electrically decoupled from the input matching network so that inductor L1 alone is serially connected to the input of transistor 14 providing the desired phase angle rotation and optimally matching the input of transistor 14 through the remainder of fixed value components of the input matching network 12, here for example, a 50 ohm RF input at 13. Threshold for state change is controlled by the input signal RF power level, the coupling coefficient and location of the coupling network CN, the bias network configuration BN and optional bias, the diode D1 output voltage sensitivity, and resistor R5 value. It should be understood that the inductors L1 and L2 could just as easily be capacitors, as a multitude of input matching networks may be realized utilizing various reactive and resistive component configurations. In this schematic, the reconfigurable elements are in series with RF signal flow (13 to 16) but could also be configured in parallel with RF signal flow, again, depending upon input matching network configurations choice—the key takeaway whether inductive, capacitive or resistive is they are combined at low level and isolated at high level for a depletion-mode (i.e., d-FET) switching transistor such as Q2 and Q3. For the parallel reconfigurable element shown, notional inductors and resistors increase in value or notional capacitors reduce in value for a low to high level RF drive change at the input to the amplifier 10.

The input matching network 12 also includes a non-configurable portion 24 having an inductor L5 and a pair of capacitors C6 and C7 arranged as shown.

The output 16 of the input matching network 12 is RF alternating current (AC) coupled to the gate of transistor 14 through a capacitor C2. Biasing to the gate and drain of transistor 14 are provided by the voltages Vg and Vd, such bias being direct current (DC) coupled to the gate and drain through inductors L3 and L4, respectively, and additionally AC coupled to ground through capacitors C3 and C4, respectively, as shown to prevent unwanted RF signals at the power supplies.

Thus amplifier 10 is a 1-stage amplifier with reconfigurable input matching network 12 controlled by the power level sensing circuit 18. The gain stage includes DC blocking capacitors C2 and C5 (constraining the Vg and Vd bias travel), DC bias injection chokes L3 and L4, as well as, RF bypass capacitors C3 and C4. The reconfigurable input matching network 12 includes the partial matching network which includes the fixed value input matching elements, L5, C6 and C7. Switching transistors Q2 and Q3, gate isolation resistors R1 and R2, bias pull-down resistors R3 and R4 form a practical switch function. The power level sensing circuit 18 includes the RF coupling element (CN), DC bias network (BN), detector circuit containing rectifying diode D1, RF bypass capacitor C1, and load resistor R5. This results in an adjustable output signal related to RF input amplitude that triggers Q2 and Q3 switching. Switch trigger threshold adjusted by varying CN coupling factor, BN bias levels, and resistor divider networks utilizing resistors R1/R2 and R5.

Figure 6:
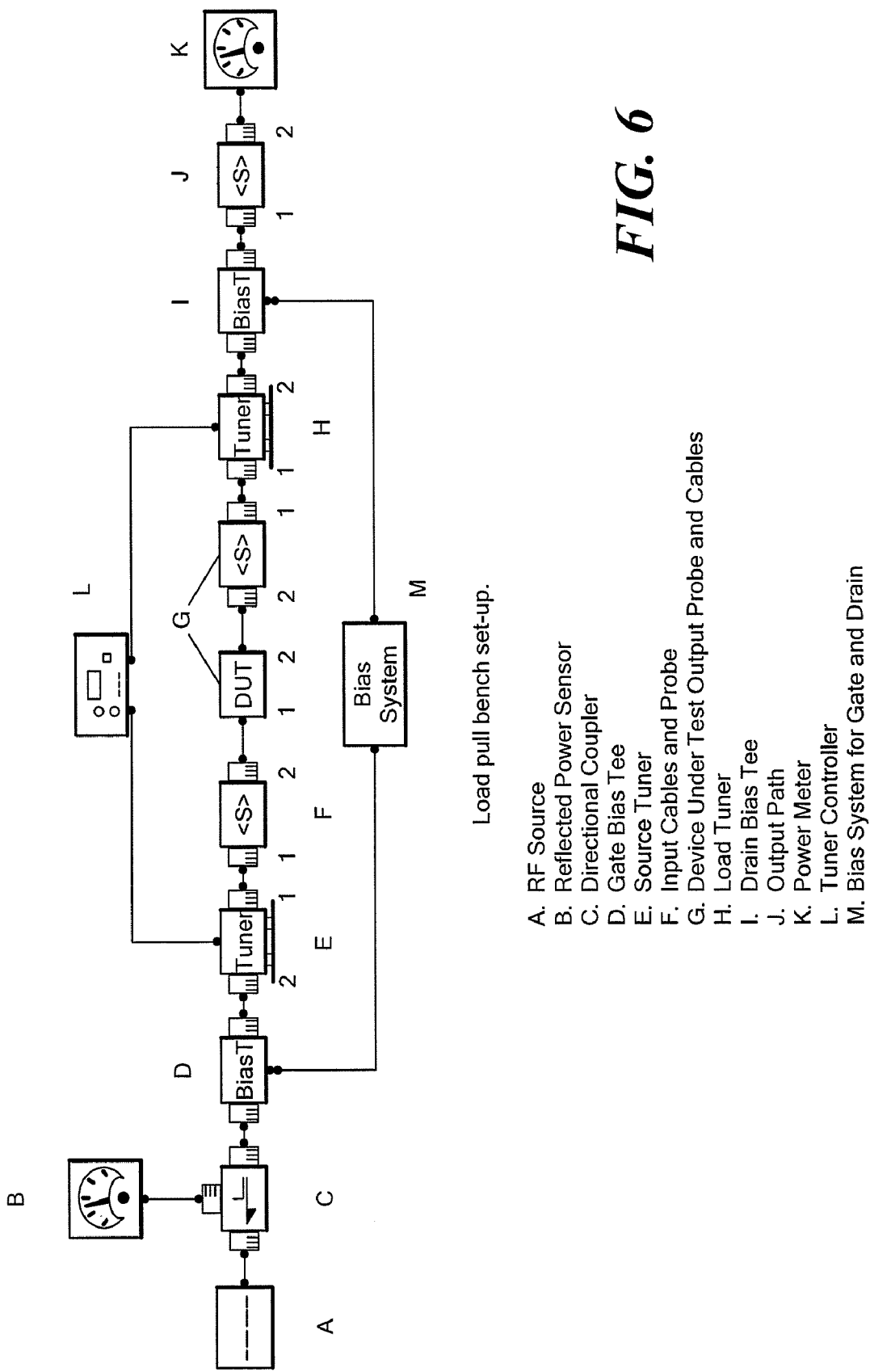
FIG. 6 is a load pull bench test set-up 10 used to test devices and generate the results to be described herein.

Referring now to FIG. 6, a load pull bench set-up 10 used to generate the results to be described herein is shown. The set-up 10 is a commercial unit manufactured by Maury. The discovery of this invention came about during the course of load pull measurements at a frequency of 3 GHz on GaN FETs with a field plate. As shown in FIG. 6, the set-up includes of a device under test (DUT) 12 which in this case the device under test (DUT) 12 was a 2.64 mm (12×220 um) GaN FET device. On either side of the device 12 are source and load tuners denoted by 14 and 16. The set-up 10 also includes: an RF source 18, a Reflected Power Sensor 20, a Directional Coupler 22, a Gate Bias Tee, 24, a Source Tuner, 26, Input Cables and Probe, 28, a Drain Bias Tee 32, an Output Path, 34 a power Meter 36, a tuner Controller 38 and a Bias System for Gate and Drain 34. The source tuner 14 allows the setting of the source match to the input of the device 12, while the load tuner 16 can be set to scan various output load match conditions. The system software calculates and plots the output load contours both for power and efficiency. Similarly, for fixed output load match the system allows one to determine the optimum source match.

The laboratory procedure uses the set-up 10 for performing device load pulls the standard way (or old way) described above, which leads to soft compression, versus a new procedure, to be described, which reduces or removes soft compression. The Q point of the device is here set to 28V and 100 ma/mm.

The procedure to design the input impedance for the device 12 is as follows:

As before, the load is matched to 50 Ohms, and a small signal source pull is performed on the device 12 to determine best source match for best power. Alternatively, the source match location on the Smith chart can also be obtained from S-parameters of the device at 3 GHz, which is the chosen frequency for this experiment. This source match is also called a small signal conjugate match to the input of the device 12. Next, with this source match fixed, a load pull of the device 12 is performed from low to high drive levels. The drive level should be high enough to drive the output at least 3 dB into compression. Now, however, unlike the old procedure, the output of the device 12 is at its optimum power target and a source pull is performed on the device 12 at the large signal input drive level and Pout versus Pin transfer curves are obtained at the power and efficiency load targets. The system also records Gt and Gp (transducer gain and power gain), reflected power from the device input (S11) or return loss among several other measurement related parameters. The new source match (large signal source match) location is found to rotate clockwise about 10 to 15 degrees on the Smith chart from the small signal conjugate match point. The same steps can be followed to obtain the location of the large signal source match under efficiency load conditions. It was found that locations of both these large signal source match points are within close proximity of each other on the Smith chart, so that they can be considered as being one and the same. Next, this source match is fixed and power sweeps (transfer curves) are performed for both power and efficiency load targets. The sweeps indicate that soft compression is considerably reduced for both load conditions. Transfer curves are obtained for periodically spaced points between the original small signal source match and the new large signal source match. This same technique has been applied to GaN transistors at X-band, and the same approximately 10 degree clockwise rotation of the source input match has been found to be true.

Thus, a method is provided for designing an input network for a GaN transistor device. The method includes: driving the device through the input network E with a relatively large input signal power level; varying parameters of the input network E with the output of the device at a predetermined output power level. That is, E is the input tuner, which allows various matches throughout the Smith Chart to be presented to the device. Likewise H is the output tuner and can also be varied; measuring transfer function performance parameters of the device as the input network parameters are varied; and selecting the input network parameters from the measured transfer function performance parameters.

Analysis of Measurements

Figure 7:
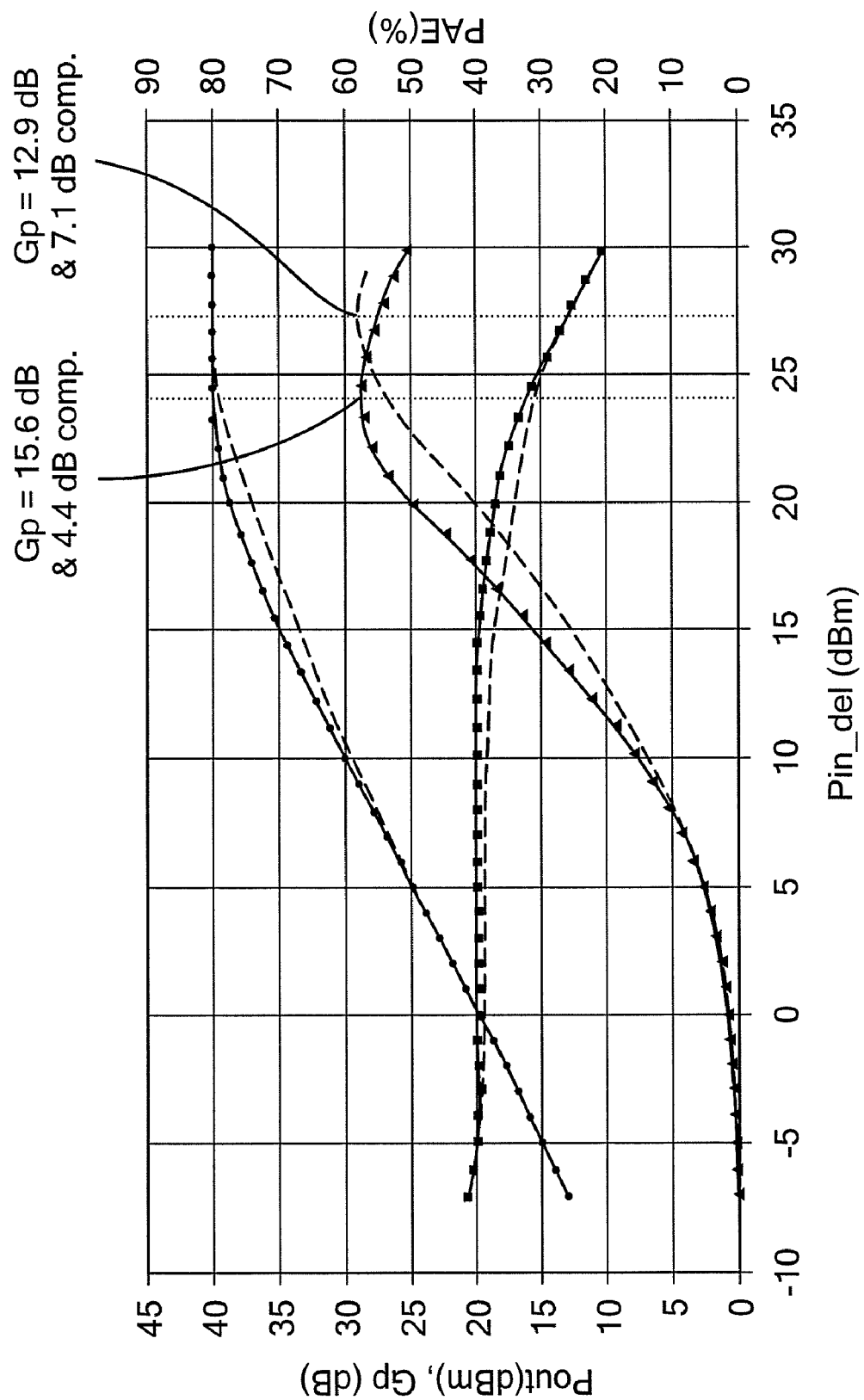
FIG. 7 are curves of Pout versus Pin characteristics of a 2.5 mm GaN FET device with a conjugate small signal source match (dotted lines) and a large signal source match (solid lines), the FET being terminated in a load for maximum power.
Figure 8:
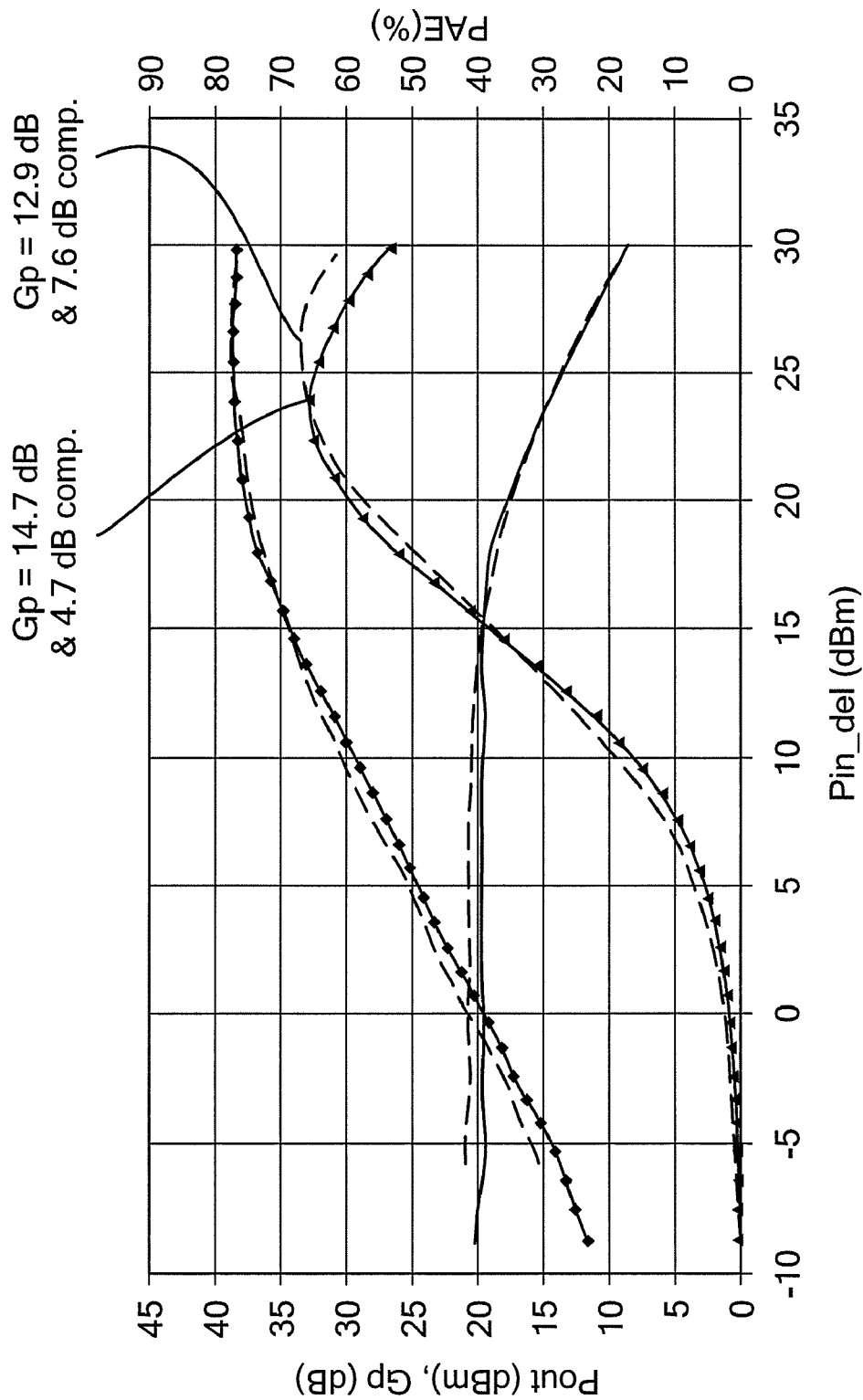
FIG. 8 are curves of Pout versus Pin characteristics of a 2.5 mm GaN FET device with a conjugate small signal source match (dotted lines) and a large signal source match (solid lines), the device being terminated in a load for maximum efficiency.

GaN FETs with field plates have been observed to exhibit soft gain compression characteristics, the degree of soft compression varying with the output load impedance presented to the device. For instance, it has been observed that a device matched to a power load impedance has very soft compression characteristics, while a device matched to an efficiency load exhibits considerably improved compression characteristics. This is illustrated in FIGS. 7 and 8 from Pout versus Pin measured load pull data, for power and efficiency load cases. Note that FIGS. 7 and 8 give measured load pull data of a GaN FET for two different output load match conditions, power and efficiency. Both figures plot Pout, Gain and Efficiency versus Pin. The dotted lines in each figure correspond to small signal input source match conditions that result in soft compression. The solid line curves illustrate how the soft compression is reduced when the input source match is set under large signal conditions. Of the two figures, FIG. 7, where the FET output is matched to a power load, illustrates the problem of soft compression more clearly. It is less severe in FIG. 8 where the FET is matched at its output to an efficiency load.

The source match for the dotted curves is a standard small signal conjugate match to the input of the device. The device under measurement was a 2.5 mm GaN FET with a field/gamma gate biased at 24V, 100 ma/mm and the CW measurement is performed at 3 GHz. Pout versus Pin characteristics of a 2.5 mm GaN FET with a conjugate small signal source match (dotted lines) and a large signal source match (solid lines). The device is terminated in a load for maximum power.

It is quite apparent, especially from FIG. 7 that under a small signal source match the device exhibits considerable amount of soft compression. When the input of the device is re-matched under large signal drive conditions, the compression characteristics are more "normal" as illustrated by the solid lines. A measure of the soft compression is the rate at which the gain drops off with input drive. If we analyze the data in FIG. 7 further, we find that for the standard source match case (dotted lines) the device hits 1 dB compression point at Pin=15 dBm. From Pin=15 dBm to 25 dBm the gain falls at the rate of 0.3 dB/dB and beyond that at a rate of 0.9 dB/dB. For the large signal source match condition (solid lines) the device reaches 1 dB compression at Pin=21 dBm and then the gain drops at the rate of 0.9 dB/dB, which is very close to the conventionally accepted measure of gain drop-off of 1 dB/dB and typically what is observed with GaAs pHEMTs. Note also from this data that for the large signal match case the PAE peak occurs with the device 4.4 dB compressed with a gain of 15.6 dB, while in the small signal input match case the gain of the device at the PAE peak is 12.9 dB and the device is 7.1 dB comp. This difference has implications in the way a 2-stage power amplifier (PA) is matched at the input of each stage, the way the FETs are sized in the amplifier and consequently the impact on the efficiency of the power amplifier.

Figure 9:
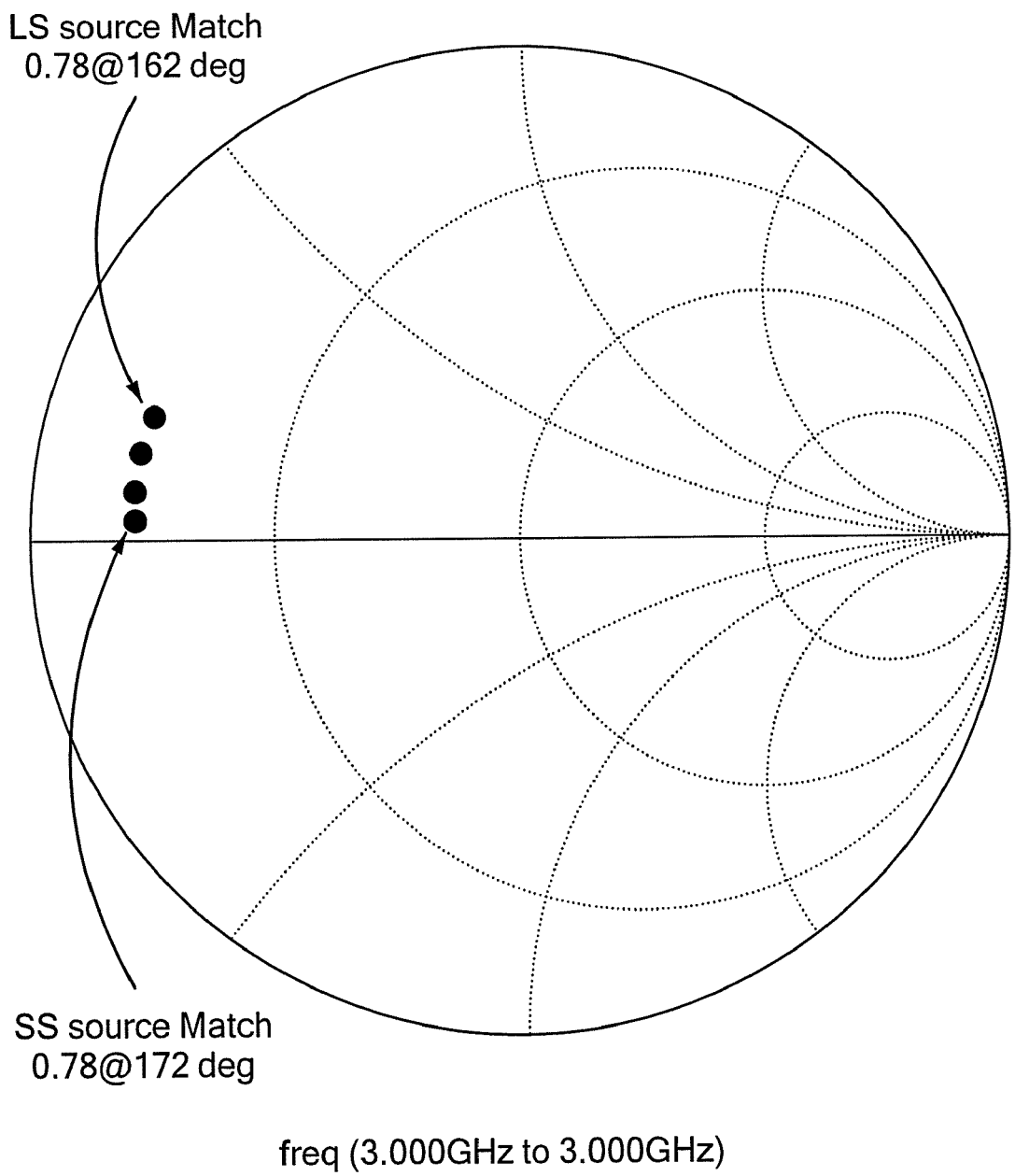
FIG. 9 shows the location of the small signal and large signal source matches for a device under test on the Smith chart.

The location of the small signal and large signal source match impedances is illustrated in the Smith chart in FIG. 9. The source impedance goes through a clockwise rotation of at least 10 degrees from the small signal source match location and can be as much as 15 degrees to obtain the best source match under large signal conditions. As the source match is rotated from small signal to the large signal case for a given large signal Pin, the degree of soft compression goes from "bad" to normal as illustrated in FIG. 7 earlier. That is the input network feeding the transistor is designed by: plotting the complex conjugate of the gate to source impedance of the transistor on an impedance Smith chart; and then rotating the plot 10-15 degrees clockwise on the impedance Smith chart to obtain the input impedance of the input network.

Figure 10:
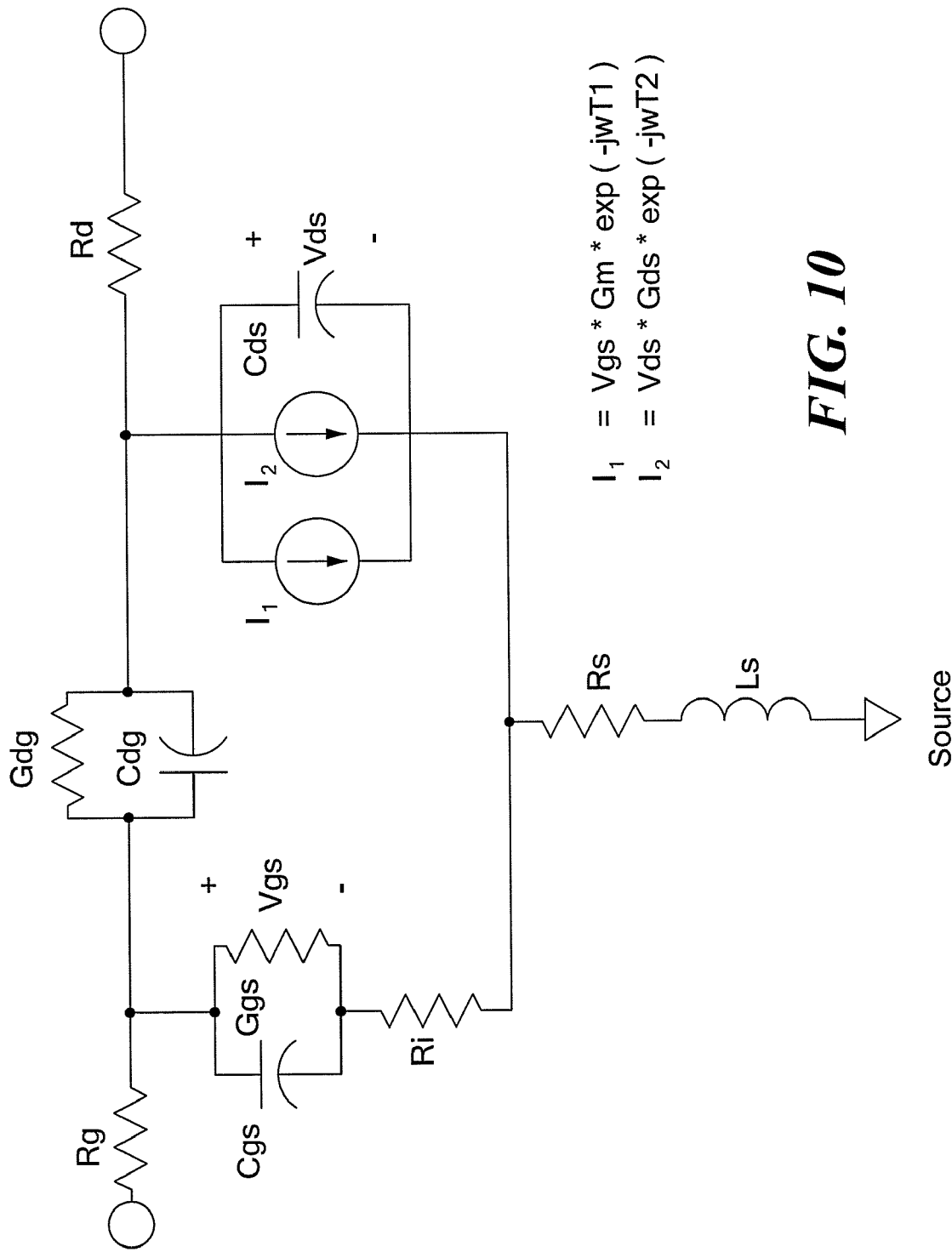
FIG. 10 is a small signal model of the GaN transistor device of FIG. 1.
Figure 11:
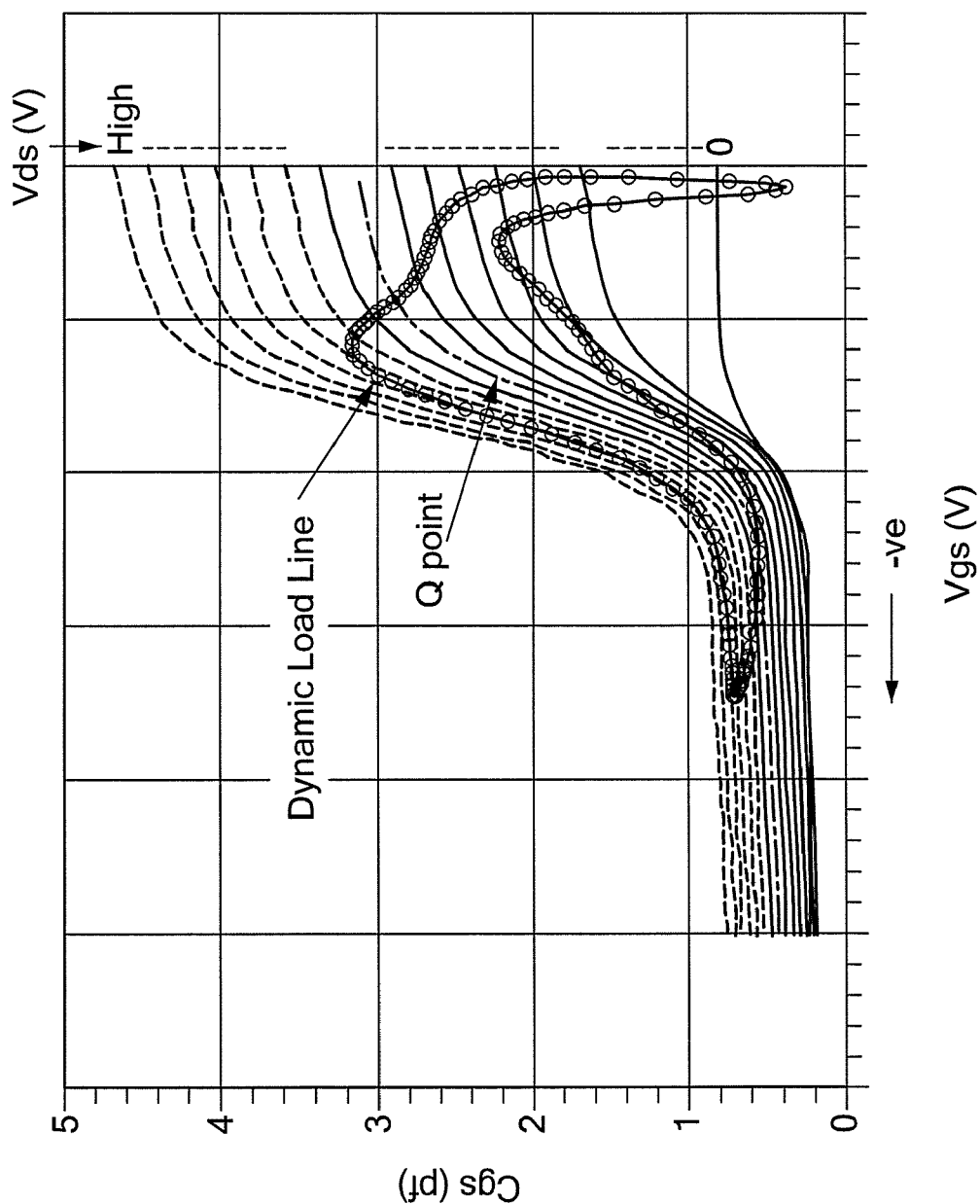
FIG. 11 is a plot of Cgs versus Vds and Vgs with the large signal dynamic load line superimposed for a device under test.

The soft compression phenomenon is peculiar in general to high voltage devices (>15V operation) and in particular to GaN devices with a field plate. One way to understand this behavior is from the small signal model of a GaN FET shown in FIG. 10. The input match of the device is controlled to a first order by three intrinsic parameters Cgs—gate-source capacitance, Cgd—gate-drain capacitance and gm—transconductance. Rs (source resistance) and Rg (gate resistance) also contribute to the input impedance, but these are considered parasitics and are not bias dependent. Cgs, Cgd and gm are strongly bias dependent, i.e they are a function of Vds (drain-source voltage) and Vgs (gate-source voltage). For instance, FIG. 11 illustrates how Cgs varies with Vgs and Vds. When the dynamic loadline for large signal drive, for class AB operation of the device, is superimposed on the Cgs plane, it is quite apparent that the Cgs value at the Q point and small signal match conditions is no longer valid at high drive. In fact we can derive an equivalent large signal Cgs value. A similar analysis would hold for Cgd and gm. The performance of the device under large signal conditions could be represented by a new small signal input drive dependent model in which the parameters Cgs, gm and Cgd could be represented as follows: $Cgs = A1 + B1*Pin + C1*Pin^2$, $gm = A2 + B2*Pin + C2*Pin^2$ and $Cgd = A3 + B3*Pin + C3*Pin^2$.

where: A1 is a constant;
B1 is a constant;
C1 is a constant:
A2 is a constant;
B2 is a constant;
C2 is a constant;
A3 is a constant;
B3 is a constant; and
C3 is a constant.

A number of embodiments of the invention have been described. Nevertheless, it will be understood that various modifications may be made without departing from the spirit and scope of the invention. For example, it should be understood that other arrangements and different passive elements of inductors and capacitors may be used for the impedance matching network so that such network provides impedance matching at both low and high input signal power levels. Further, while a common-source configuration has been described, the impedance matching network may be appropriately modified for other transistor configurations such as common-gate or common-drain. Further, if enhancement-mode transistors are used for the switches 20 and 22, the input matching network would be appropriately modified with other passive element configurations to provide impedance matching at both low and high input signal power levels. Accordingly, other embodiments are within the scope of the following claims.

What is claimed is:

1. A method for designing an input network for a GaN transistor device with a field or Gamma gate comprising:
driving the device through the input network with a relatively large input signal power level;
varying parameters of the input network with the output of the device at a predetermined output power level;
measuring transfer function performance parameters of the device as the input network parameters are varied;

selecting the input network parameters from the measured transfer function performance parameters.

2. A method for designing an input network feeding a transistor comprising: plotting the complex conjugate of the gate to source impedance of the transistor on an impedance Smith chart; and rotating the plot 10-15 degrees clockwise on the impedance Smith chart to obtain the input impedance of the input network.

* * * * *

UNITED STATES PATENT AND TRADEMARK OFFICE
CERTIFICATE OF CORRECTION

PATENT NO. : 7,528,649 B2
APPLICATION NO. : 11/851418
DATED : May 5, 2009
INVENTOR(S) : Whelan et al.

It is certified that error appears in the above-identified patent and that said Letters Patent is hereby corrected as shown below:

In the Specification

Col. 1-2, line 67-1, delete "to square root" and replace with -- to the square root --.

Col. 2, line 33, delete "determine best" and replace with -- determine the best --.

Col. 4, line 10, delete "degree" and replace with -- degrees --.

Col. 4, line 10, delete "Chart." and replace with -- chart. --.

Col. 4, line 22, delete "provided" and replace with -- provide --.

Col. 6, line 13, delete "inductor" and replace with -- inductors --.

Col. 6, line 55, delete "to signal" and replace with -- to a signal --.

Col. 7, line 57-58, delete "threshold adjusted" and replace with -- threshold is adjusted --.

Col. 7, line 66, delete "of a device" and replace with -- a device --.

Col. 8, line 65, delete "Chart" and replace with -- chart --.

Col. 9, line 66, delete "from signal" and replace with -- from the signal --.

Signed and Sealed this
Twenty-fifth Day of March, 2014

Michelle K. Lee
*Deputy Director of the United States Patent and Trademark Office*